United States Patent [19]
Jun et al.

[11] Patent Number: 5,874,357
[45] Date of Patent: Feb. 23, 1999

[54] METHOD OF FORMING WIRING STRUCTURE OF SEMICONDUCTOR DEVICE

[75] Inventors: Young-Kwon Jun, Seoul; Yong-Kwon Kim, Choongcheongbook-Do, both of Rep. of Korea

[73] Assignee: LG Semicon Co., Ltd., Choongcheongbuk-Do, Rep. of Korea

[21] Appl. No.: 770,158

[22] Filed: Dec. 19, 1996

[30] Foreign Application Priority Data

Dec. 29, 1995 [KR] Rep. of Korea .................. 1995/67324

[51] Int. Cl.$^6$ ............................................... H01L 21/4763
[52] U.S. Cl. .............................................. 438/638
[58] Field of Search ..................... 437/195, 228; 438/465, 631, 635, 639, 703, 763, 638

[56] References Cited

U.S. PATENT DOCUMENTS 521,792   7/1991  Kim et al. .............................. 437/195
4,556,897  12/1985  Yorikane et al. ........................ 357/71

*Primary Examiner*—Charles L. Bower, Jr.
*Assistant Examiner*—Reneé R. Berry
*Attorney, Agent, or Firm*—Morgan, Lewis & Bockius LLP

[57] ABSTRACT

A wiring structure of a semiconductor device includes a substrate; a first conductive layer formed in the substrate; an insulation film formed on the substrate including the first conductive layer and having a contact hole therein through which the upper surface of the first conductive layer is exposed, wherein the contact hole includes an upper contact hole and a lower contact hole having a shape undercut into the insulation film and thus being wider than the upper contact hole; and a second conductive layer formed on the insulation film so as to thoroughly fill the contact hole and electrically connected to the first conductive layer.

16 Claims, 8 Drawing Sheets

METHOD OF FORMING WIRING STRUCTURE OF SEMICONDUCTOR DEVICE

BACKGROUND OF THE INVENTION

1. Field of the Invention

The present invention relates to a wiring structure for a semiconductor device, and more particularly to a wiring structure and formation method thereof for a semiconductor device capable of decreasing a contact resistance by forming a shape provided in a lower portion of a contact hole and undercut into an insulation film.

2. Description of the Prior Art

With a semiconductor circuit increasingly integrated, there is a trend wherein breadth of each conductive wire in semiconductor devices or circuits becomes narrowed.

The decreasing wire breadth in each of the conductive wires also applies to metalization for electrically connecting conductive regions to each other. In addition, the size of a contact hole for contacting a conductive wire to another is decreasing as well.

According to U.S. Pat. No. 4,556,897, during an aluminum applied metallic wiring process a lower and upper wiring layers are contacted to each other in contact holes for maintaining continuity property of aluminum.

However, U.S. Pat. No. 4,556,897 does not provide a solution to an increased contact area and contact resistance when there occurs a misalignment of a mask in forming a contact hole. Besides, it does not apply to a self-aligned contact hole.

With reference to FIG. 1, a conventional wiring structure in a semiconductor device will now be described.

In a portion of the surface of a substrate 1 there is formed a lower conductive layer 2 serving as a conductive wire. After depositing an insulation film 8 on the substrate 1 including the lower conductive wire 2, a contact hole 4 is formed through the insulation film 8 by a selective etching. FIG. 1 also shows a misalignment of the contact hole 4 against the lower conductive layer 2 for a certain reason, which misalignment causes the externally exposed area of the lower conductive layer 2 to be decreased.

Therefore, when there occurs a mask misalignment against the contact hole 4 the area of the conductive wire 2 exposed through the contact hole decreases, whereby the contact resistance increases and accordingly signal transfer in a semiconductor device can be delayed. As a result, the thusly increased resistance may generate current crowing and then electromigration, thereby deteriorating the reliability of a semiconductor device.

SUMMARY OF THE INVENTION

Accordingly, it is an object of the present invention to provide a wiring structure and formation method thereof for a semiconductor device capable of minimizing the area of a conductive wire exposed through a misaligned contact hole.

To achieve the above-described object, the wiring structure of a semiconductor device includes a substrate; a first conductive layer formed in the substrate; an insulation film formed on the substrate including the first conductive layer and having a contact hole therein through which the upper surface of the first conductive layer is exposed, wherein the contact hole includes an upper contact hole and a lower contact hole having a shape undercut into the insulation film and thus being wider than the upper contact hole; and a second conductive layer formed on the insulation film so as to thoroughly fill the contact hole and electrically connected to the first conductive layer.

Further, the fabrication method of a wiring structure of a semiconductor device includes forming a first conductive layer and a sacrificial layer sequentially on a substrate, forming after patterning the sacrificial an insulation film on the substrate including the sacrificial layer, forming a contact hole by removing a portion of the insulation so as to expose a portion of the upper surface of the sacrificial layer therethrough, removing the sacrificial layer for exposing the upper surface of the first conductive layer therethrough, forming a second conductive layer on the insulation film so as to thoroughly fill the contact hole, and patterning the second conductive layer to a certain shape.

DETAILED DESCRIPTION OF THE PREFERRED EMBODIMENTS

Figure 1:
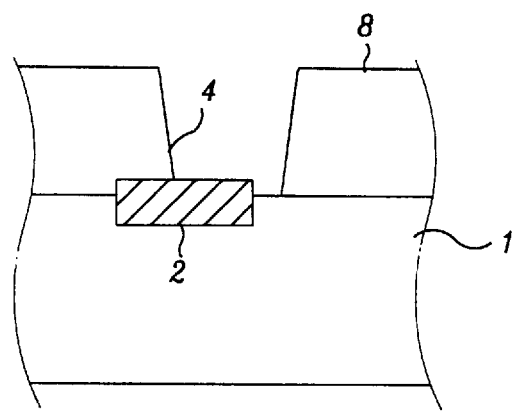
FIG. 1 is a cross-sectional view showing a conventional wiring structure in a semiconductor device.
Figure 2:
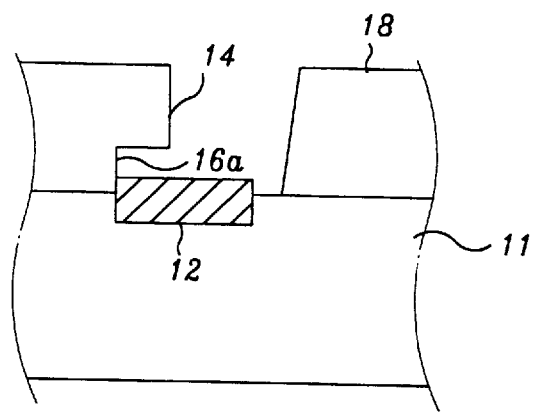
FIG. 2 is a cross-sectional view showing a wiring structure of a semiconductor device in accordance with a first embodiment of the present invention.

As shown in FIG. 2 showing a wiring structure of a semiconductor device in accordance with a first embodiment of the present invention, on a substrate 11 there is provided a lower wiring layer 12 serving as a first conductive layer. An insulation film 18 having a contact hole 14 therein is formed on the substrate 11 including the lower conductive wire 12 first. Extending from a lower portion of the contact hole 14, an opening 16a is formed in the insulation film 18, a side of which opening 16a is vertical to the conductive wire 12. Subsequently, even when there occurred a mask misalignment against the contact hole 14, the surface area of the wiring layer 12 for being contacted to the insulation film 18 can be cleared.

Figure 3:
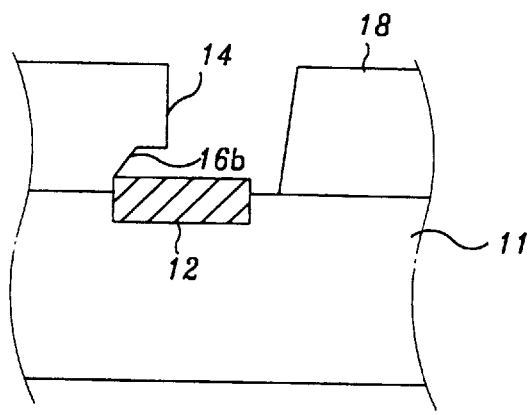
FIG. 3 is a cross-sectional view showing the wiring structure of a semiconductor device in accordance with a second embodiment of the present invention.

In accordance with a second embodiment of the present invention referring to FIG. 3 which is similar to FIG. 2 in its structure, an opening 16b has a slope along the side wall thereof so that the upper surface of the conductive wire 12 can be exposed through the contact hole 14 including the opening 16b. Therefore, as in FIG. 2, even when there occurred a mask misalignment against the contact hole 14, the area of the lower conductive wire 12 for being contacted to the insulation film 18 can be cleared.

Figure 4:
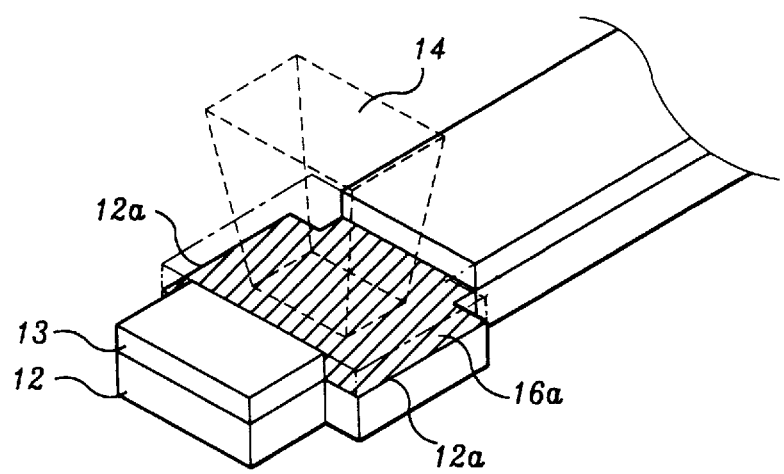
FIG. 4 is a partial perspective view showing the wiring structure of a semiconductor device in accordance with present invention.

Meanwhile, FIG. 4 is a partial perspective view having an enlarged imaginary rectangular column for showing a contact hole layout in the wiring structure of the present invention, wherein the dotted part denotes the upper contact hole 14. The hatched portion in the drawing represents the exposed upper surface of the first conductive layer 12. Reference numeral 13 denotes a victim layer. Also, an edge 12a provided at each of the front and back in the wiring structure but not shown in the other drawings is formed to maximize the area of the first conductive layer 12 exposed through the contact hole 14 including an opening 16a.

Figure 5A:
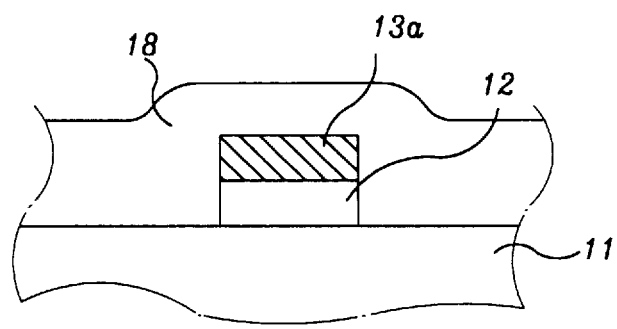
FIGS. 5A through 5D are cross-sectional views each for showing a forming method of the wiring structure of a semiconductor device in accordance with the first embodiment of the present invention.
Figure 5B:
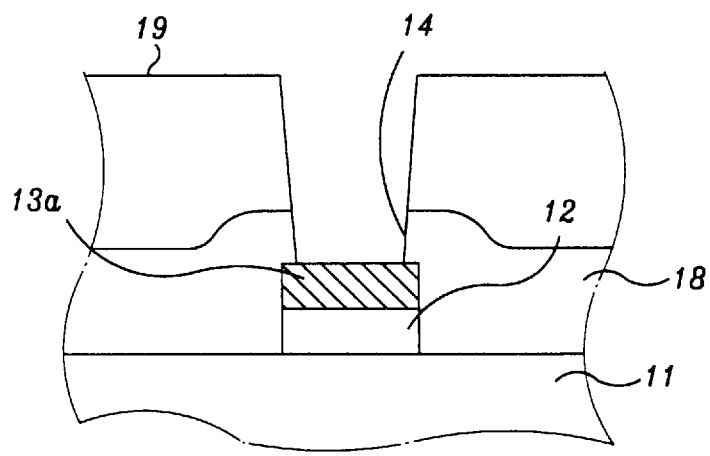
Figure 5C:
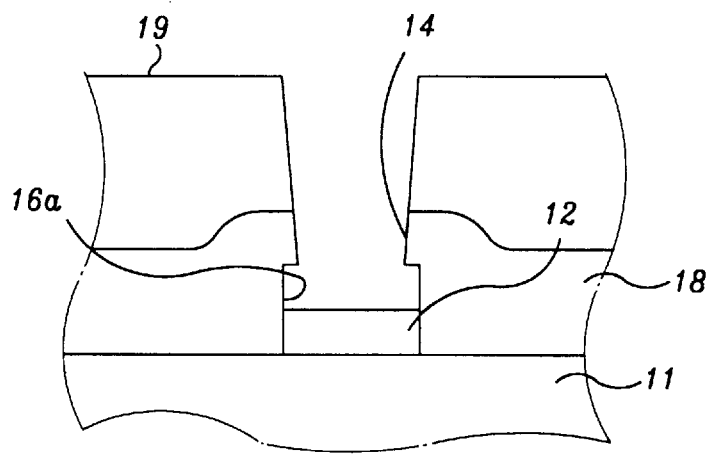
Figure 5D:
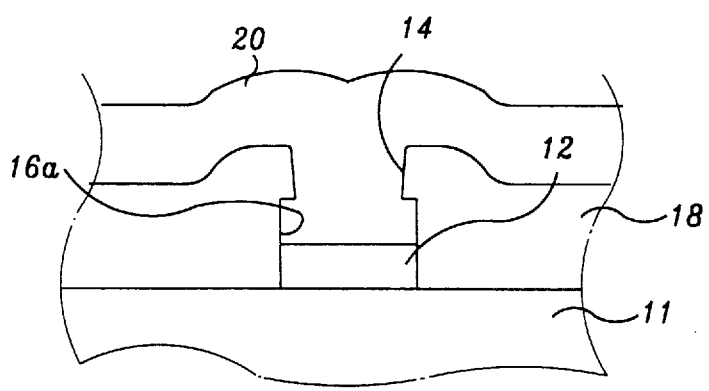

With reference to FIG. 5D, the wiring structure in accordance with the first embodiment of the present invention includes the substrate 11, the first conductive layer 12 formed on the substrate 11, the insulation film 18 having a contact hole through which the upper surface of the first conductive layer 12 is exposed, and a second conductive layer 20 filling the contact hole thoroughly for electrically being connected to the first conductive layer 12.

The contact hole includes an upper contact hole 14 and a lower contact hole 16a having a shape undercut into the insulation film 18 and thus being wider than the upper contact hole 14. Each side wall of the lower contact hole 16a is vertical to the first conductive layer 12.

With reference to FIGS. 5A through 5D, the fabrication steps of the wiring structure in accordance with the first embodiment will now be described.

First, as shown in FIG. 5A, on a substrate 11 there is patterned a structure sequentially laminated with a first conductive layer 12 and a sacrificial layer 13a.

As shown in FIG. 5B, using a photo resist film 19 as a mask an insulation film 18 is selectively etched to form the upper contact hole 14.

As shown in FIG. 5C, the sacrificial layer 13a is removed therefrom by a etching method for thereby forming the lower contact hole 16a.

As shown in FIG. 5D, the photo resist film 19 is removed therefrom and then a second conductive layer 20 serving as an upper conductive wire is formed on the insulation film 18 including the contact hole by means of a technique such as a chemical vapor deposition (CVD). Thereafter, the surface of the second conductive layer 20 is patterned to a certain shape.

The insulation film 18, as shown in FIG. 5A, is formed as a single structure composed of a silicon oxide film by applying thereto a plasma CVD, or as a laminated structure composed of an ointment silicon oxide film such as SOG (silicon on glass) and a silicon oxide film applied to a plasma CVD. The sacrificial layer 13a is formed of an insulation material such as silicon nitride which has etch selectivity against each of a silicon oxide film and an aluminum film which serves as the first conductive layer 12, or of a conductive material such as TiW or W.

The sacrificial layer 13a, as shown in FIG. 5B, serves as an etching stopper when etching an insulation film. Anisotropic dry etching in which to employ gas such as $CF_4$ or $CHF_4$ can be applied to etch the insulation film 18. The upper contact hole 14 is provided by etching the insulation film 18 but the lower contact hole 16a provided above the first conductive layer 12 is formed by removing the victim layer 13a by applying thereto an etch selectivity.

Therefore, the lower contact hole 16a constantly secures a wider space than the upper contact hole 14, thereby becoming a self-aligned contact hole for exposing the surface of the first conductive layer 12 therethrough.

To remove the sacrificial layer 13a as shown in FIG. 5C, a wet etching technique using a solution of $H_3PO_4$ or an isotropic dry etching technique using gas such as $SF_6$ can be applied thereto.

In FIG. 5D, a CVD technique is employed to sufficiently coat all the walls of the lower contact hole 16a with a conductive material by applying thereto a heat dissolution technique.

Figure 6A:
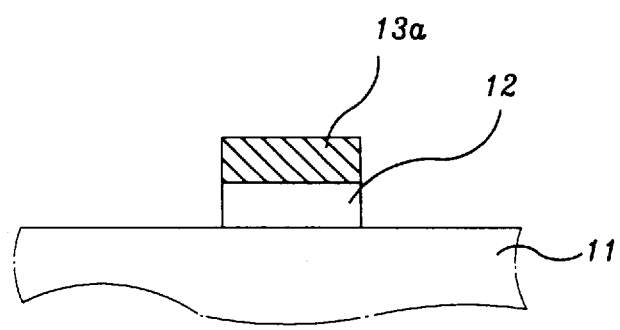
FIGS. 6A through 6F are cross-sectional views each for showing a forming method of the wiring structure of a semiconductor device in accordance with the second embodiment of the present invention.
Figure 6B:
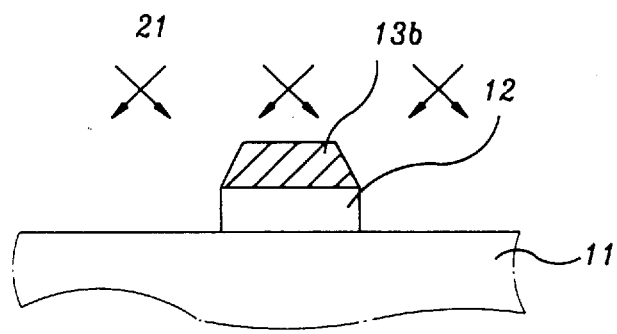
Figure 6C:
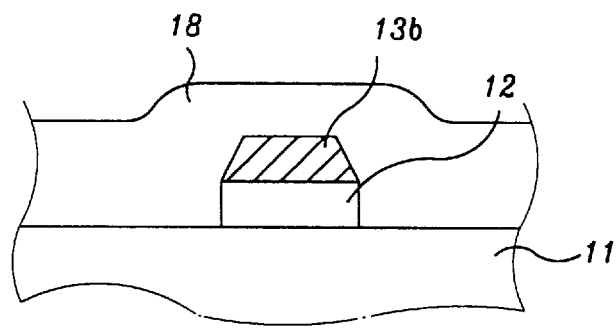
Figure 6D:
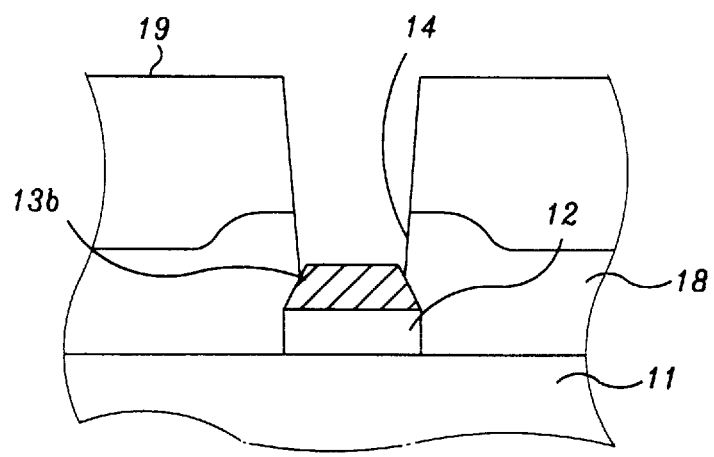
Figure 6E:
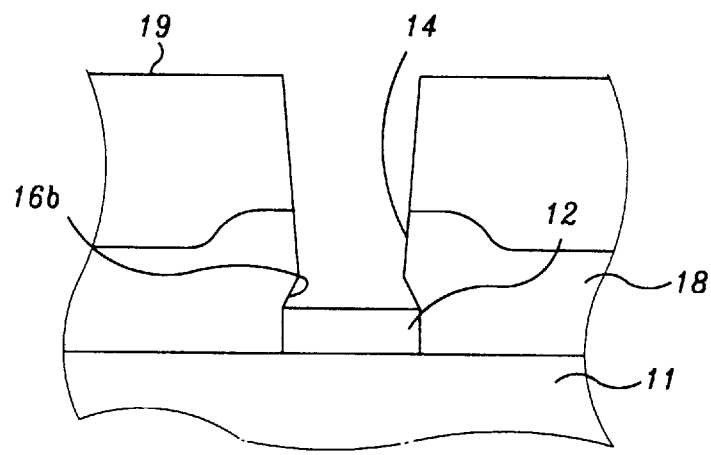
Figure 6F:
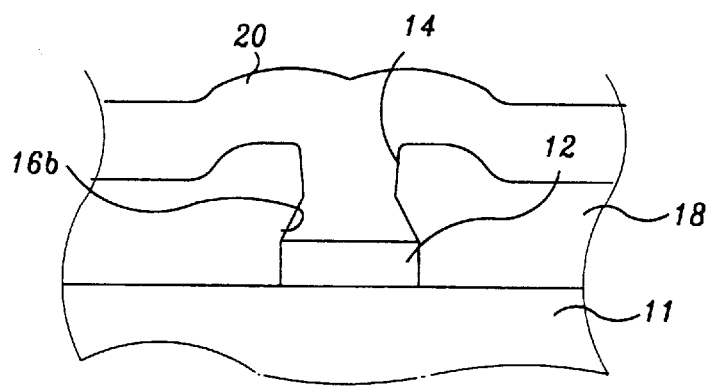

Referring to FIG. 6F, the second embodiment of the present invention includes the substrate 11, the first conductive layer 12 formed on the substrate 11, the insulation film 18 formed on the substrate 11 and the first conductive layer 12 but having a contact hole therein through which the upper surface of the first conductive layer 12 is exposed, and the second conductive layer 20 formed on the insulation film 18 and also filling the contact hole thoroughly for electrically being connected to the first conductive layer 12.

The contact hole includes an upper contact hole 14 and a lower contact hole 16a having a shape undercut into the insulation film 18 and thus being wider than the upper contact hole 14. Each side wall of the lower contact hole 16a is slanted to the first conductive layer 12.

With reference to FIGS. 6A through 6F, the fabrication steps of the wiring structure in accordance with the second embodiment will now be described.

First, as shown in FIG. 6A, on a substrate 11 there is patterned a structure sequentially laminated with a first conductive layer 12 and a victim layer 13a.

As shown in FIG. 6B, using a plasma of halogen gas 21 such as Ar, each edge of the sacrificial layer 13a is etched by a sputtering technique, thereby forming an edge-etched victim layer 13b.

As shown in FIG. 6C, an insulation film 18 for insulating conductive layers is formed on the substrate 11 including the edge-etched sacrificial layer 13b formed on the first conductive layer 12.

As shown in FIG. 6D, using a photo resist film 19 formed on the insulation film 18 as a mask, the insulation film 18 is etched to form an upper contact hole 14 therethrough.

As shown in FIG. 6E, the edge-etched sacrificial layer 13b is removed therefrom by applying thereto etch selectivity for thus forming a lower contact hole 16b.

As shown in FIG. 6F, the photo resist film 19 is removed therefrom and then a second conductive layer 20 serving as an upper conductive wire is formed on the insulation film 18 including the contact hole by means f a technique such as a chemical vapor deposition (CVD). Thereafter, the surface of the second conductive layer 20 is patterned to a certain shape.

Meanwhile, the etching step in FIG. 6B serves to improve the quality of coating a conductive material on all the sides of the lower contact hole 16b in FIG. 6F and accordingly a physical deposition technique such a sputtering, as well as a CVD technique can be applied thereto.

To form the first and second conductive layers which are incorporated into each of the first and second embodiments of the present invention, a highly conductive metal such as Cu or Pt, or their compound metal, as well as a conventionally employed aluminum or its compound metal, can be applied thereto.

According to the wiring structure and its forming method of the present invention as described above, although there occurred a mask misalignment against the lower conductive layer and the contact hole, the self-aligned lower contact hole maximizes the surface area of the first conductive layer being exposed through the contact hole, thereby reducing a contact resistance and also obtaining a high reliability in semiconductor devices.

What is claimed is:

1. A method of forming a wiring structure of a semiconductor device, comprising the steps of:

forming a first conductive layer and a sacrificial layer sequentially on a substrate;

patterning the first conductive layer and the sacrificial layer;

forming an insulation film on the substrate including the first conductive layer and the victim layer;

forming a first contact hole in the insulation film by removing a portion of the insulation film so as to expose a portion of the upper surface of the sacrificial layer therethrough;

removing the sacrificial layer entirely to form a second contact hole below the first contact hole, the second contact hole having a width wider than that of the first contact hole and the size of the second contact hole being equal to the space left after removing the victim layer; and forming a second conductive layer on the insulation film so as to thoroughly fill the first contact hole.

2. The method according to claim 1, further comprising a step of etching each edge of the sacrificial layer by sputtering using a halogen plasma.

3. The method according to claim 1, wherein the second contact hole has a side wall perpendicular to the first conductive layer.

4. The method according to claim 1, wherein the second contact hole has an side wall inclined with respect to the first conductive layer.

5. The method according to claim 1, wherein the insulation film includes a silicon oxide film formed using a plasma enhanced chemical vapor deposition (PECVD) technique.

6. The method according to claim 1, wherein the insulation film includes a structure laminated with a SOG (spin on glass) layer and a silicon oxide film formed using plasma enhanced chemical vapor deposition.

7. The method according to claim 1, wherein the sacrificial layer is formed of an insulating material having an etch selectivity against other materials.

8. The method according to claim 1, wherein the sacrificial layer is formed of a conductive material having etch selectivity against other materials.

9. The method according to claim 1, wherein the portion of the insulation film is removed therefrom by an anisotropic dry etching technique.

10. The method according to claim 1, wherein the sacrificial layer is removed therefrom using a wet etching technique.

11. The method according to claim 1, wherein the sacrificial layer is removed using an isotropic dry etching technique.

12. The method according to claim 7, wherein the insulating material includes a silicon nitride film.

13. The method according to claim 8, wherein the conductive material includes one of titanium tungsten (TiW) or tungsten (W).

14. The method according to claim 9, wherein the anisotropic dry etching technique is performed using one of $CF_4$ or $CHF_4$.

15. The method according to claim 10, wherein the wet etching technique is executed in a $H_3PO_4$ solution.

16. The method according to claim 11, wherein the isotropic dry etching technique is executed using $SF_6$.

* * * * *

UNITED STATES PATENT AND TRADEMARK OFFICE
CERTIFICATE OF CORRECTION

PATENT NO. : 5,874,357
DATED : February 23, 1999
INVENTOR(S) : Young-Kwon JUN et al.

It is certified that error appears in the above-identified patent and that said Letters Patent is hereby corrected as shown below:

Column 6, line 3, change "using plasma" to --using a plasma--.

Column 6, line 4, change "vapor deposition" to --vapor deposition technique--.

Column 5, line 30, change "an" to --a--.

Signed and Sealed this

Twenty-ninth Day of February, 2000

Attest:

Q. TODD DICKINSON

*Attesting Officer*

*Commissioner of Patents and Trademarks*